(12) United States Patent
Koganei

(10) Patent No.: US 6,180,440 B1
(45) Date of Patent: Jan. 30, 2001

(54) METHOD OF FABRICATING A RECESSED-GATE FET WITHOUT PRODUCING VOIDS IN THE GATE METAL

(75) Inventor: Hirosada Koganei, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/312,220

(22) Filed: May 14, 1999

(30) Foreign Application Priority Data

May 15, 1998 (JP) .................................................. 10-133099

(51) Int. Cl.[7] .................................................. H01L 21/338
(52) U.S. Cl. .......................... 438/167; 438/576; 438/701; 438/704; 438/737; 438/175
(58) Field of Search .................................. 438/167, 172, 438/173, 175, 179, 180, 694, 701, 704, 737, 752, 571, 572, 574, 576

(56) References Cited

U.S. PATENT DOCUMENTS

| | | | |
|---|---|---|---|
| 3,986,200 | * 10/1976 | Allison .................................. | 257/521 |
| 5,023,675 | * 6/1991 | Ishikawa .............................. | 257/194 |
| 5,389,574 | * 2/1995 | Mizunuma ........................... | 438/167 |
| 5,675,159 | * 10/1997 | Oku et al. ............................ | 257/284 |
| 5,796,132 | * 8/1998 | Nakano et al. ...................... | 257/284 |
| 5,888,860 | * 3/1999 | Kohno ................................. | 438/180 |
| 5,994,753 | * 11/1999 | Nitta .................................... | 257/471 |

* cited by examiner

Primary Examiner—Carl Whitehead, Jr.
Assistant Examiner—Jamie L. Davis
(74) Attorney, Agent, or Firm—Scully, Scott, Murphy & Presser

(57) ABSTRACT

The present invention provides a method of fabricating a field-effect transistor comprising the steps of forming a masking layer having an opening therein on laminated compound semiconductor layers, removing a portion of the laminated layers using an etching solution acting through the opening and creating a gate-forming recess having sidewalls tapering in a direction away from the masking layer, filling the gate-forming recess with gate metal and forming a gate electrode, and forming a recess around the gate electrode.

13 Claims, 5 Drawing Sheets

METHOD OF FABRICATING A RECESSED-GATE FET WITHOUT PRODUCING VOIDS IN THE GATE METAL

BACKGROUND OF THE INVENTION

1. Field of the Invention

The present invention relates generally to methods of fabricating field-effect transistors, and more specifically to a method of fabricating a high-power field-effect transistor of a recessed gate structure on a compound semiconductor substrate for use in the microwave region.

2. Description of the Related Art

For high power and microwave applications, recessed gate field-effect transistors are currently used. This type of field-effect transistor has the gate electrode formed in a slot etched in a compound semiconductor substrate, such as GaAs, between the source and drain electrodes. The use of the same mask for etching the slot and depositing metal to form the gate electrode results in the gate metal being placed in the center of the slot. Use of a recessed gate structure has the advantages that the extra channel thickness on each side of the gate reduces parasitic resistances between the gate and the source and drain and that the position of the gate below the substrate surface does not restrict the ability of the gate to modulate the source-drain current under positive gate bias despite the shrinkage of the depletion region that occurs under positive bias. In addition, low noise is another demand which requires small gate length.

According to a prior art method, a silicon dioxide layer is formed on a semi-insulating substrate and then etched to form a small recess, which is then sputtered with metal. However, if this recess opens upwards with an aspect ratio equal to or greater than unity and one side of the opening is smaller than 0.2 micrometers, difficulty arises to completely fill the gate metal into the recess. This results in the filling gate metal having an undesirable "void", which in turn causes the gate to increase its resistance and weaken its structural integrity.

In order to overcome this problem, one prior-art solution employs a tapered sidewall forming process during the fabrication of a recessed-gate field-effect transistor, as shown in FIGS. 1A to 1D. According to this approach, an AlGaAs layer 2 and a GaAs layer 3 are successively formed on a GaAs substrate 1, as shown in FIG. 1A. On the GaAs layer 3 is deposited an oxide layer 4 which is then etched to form a hole 7. Using the oxide layer 4 as a photoresist, the GaAs layer 3 and AlGaAs layer 2 are isotropically wet-etched to form a recess 8 whose sidewalls slope down from the bottom of layer 4. An oxide layer 5 is then grown on the layer 4 so that it fills in the recess 8, leaving a tapered small recess 9, as illustrated in FIG. 1B. The upper oxide layer 5 is then dry-etched to create a hole 10 as illustrated in FIG. 1C. Because of the presence of the tapered recess 9, the dry etching process results in the hole 10 having a bevelled edge 10a. Metal is then sputtered as shown in FIG. 1D to form a gate electrode 6. Selected areas of the oxide layers 4 and 5 are removed by a patterned etching process to allow the subsequent metalization process to form the source and drain electrodes.

However, it is found that when the horizontal aspect ratio of hole 10 becomes equal to or greater than 2, a "void" still occurs in the filling gate metal as indicated by numeral 11 in FIG. 1D.

SUMMARY OF THE INVENTION

It is therefore an object of the present invention to provide a method of fabricating a recessed-gate field-effect transistor without producing a void in the filling gate metal.

Another object of the present invention is provide a method of fabricating a recessed-gate field-effect transistor which ensures high precision control on the gate length.

According to the present invention, there is provided a method of fabricating a field-effect transistor comprising the steps of forming a masking layer having an opening therein on laminated compound semiconductor layers, removing a portion of the laminated layers using an etching solution acting through the opening and creating a gate-forming recess having sidewalls tapering in a direction away from the masking layer, filling the gate-forming recess with gate metal and forming a gate electrode, and forming a recess around the gate electrode.

BRIEF DESCRIPTION OF THE DRAWINGS

The present invention will be described in further detail with reference to the accompanying drawings, in which.

DETAILED DESCRIPTION

In FIGS. 2A to 2F, there is shown a method of fabricating a recessed-gate field effect transistor according to a first embodiment of the present invention.

Figure 1A:
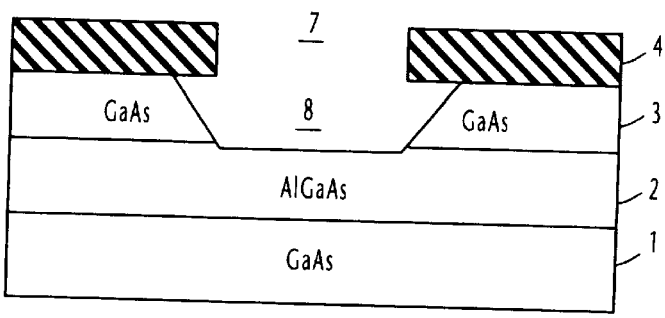
FIGS. 1A to 1D are cross-sectional views illustrating prior art steps of fabricating a field-effect transistor of a recessed gate structure.
Figure 1B:
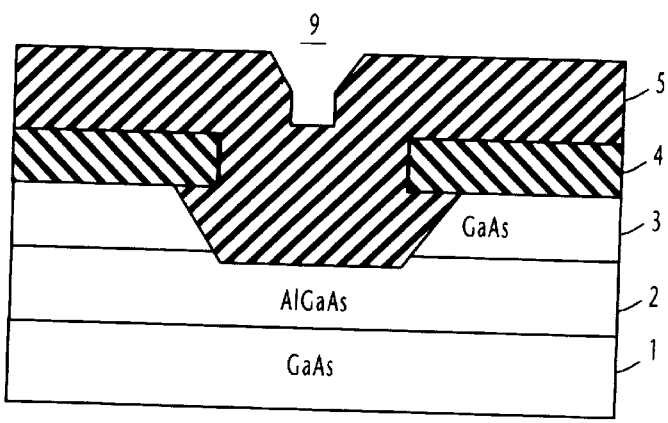
Figure 1C:
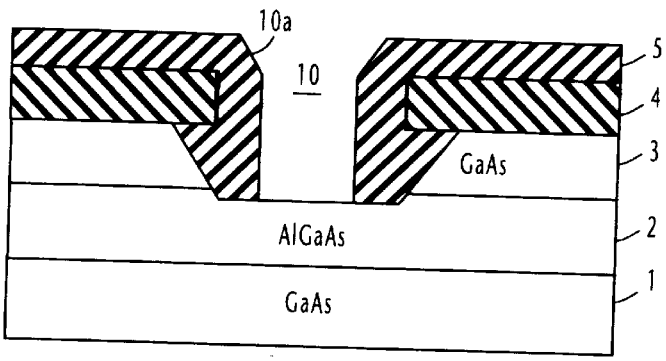
Figure 1D:
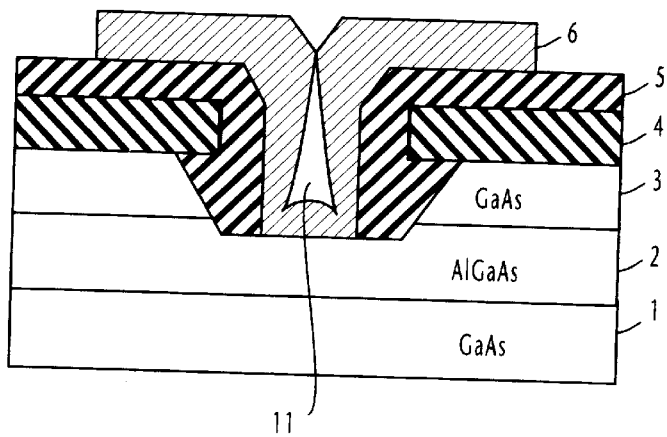
Figure 2A:
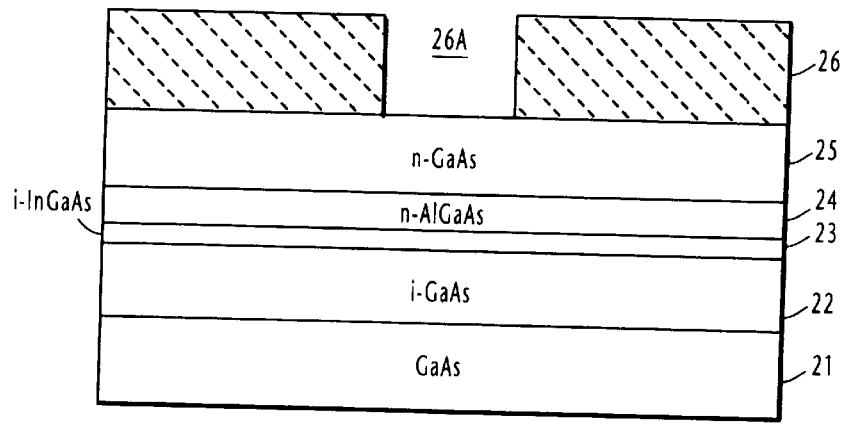
FIGS. 2A to 2F are cross-sectional views illustrating steps of fabricating a field-effect transistor of a recessed gate structure according to a first embodiment of the present invention.

In FIG. 2A, the starting material is a GaAs substrate 21 of (100) orientation on which is formed an 80-nm thick i-GaAs layer 22. This layer serves as a buffer for a channel layer 23 of i-$In_{0.15}Ga_{0.85}As$ with a thickness of 15 nm. On the channel layer 23 is a 40-nm thick electron supply layer 24 of n-$Al_{0.2}Ga_{0.8}As$ and an 80-nm thick contact layer 25 of n-GaAs. All of these layers are grown using the metal-organic chemical vapor deposition (MOCVD) or molecular beam epitaxy (MBE) method. The layers formed on the substrate 21 are epitaxially aligned to crystal plane (100) and their cross-sectional view reveals (011) crystal plane perpendicular to crystal plane (100). A photoresist 26 is lithographically deposited on a portion of the surface of n-GaAs layer 25 where a gate electrode is to be produced. Photoresist 26 is formed with a hole 26A with a horizontal dimension of 0.1 $\mu$m.

Figure 2B:
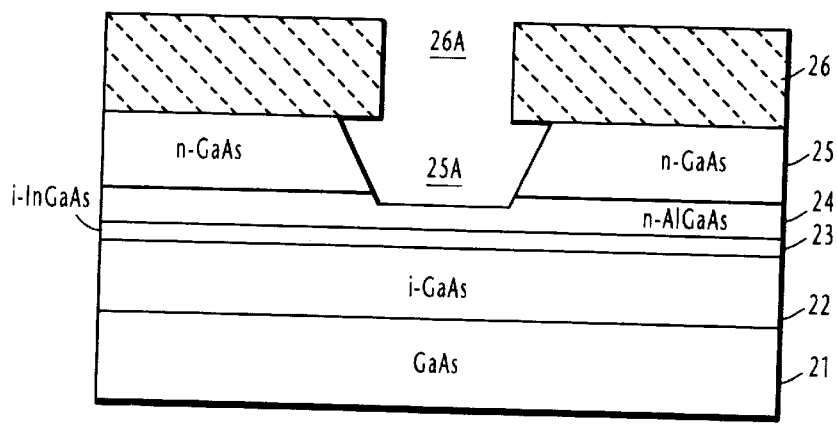
Figure 2C:
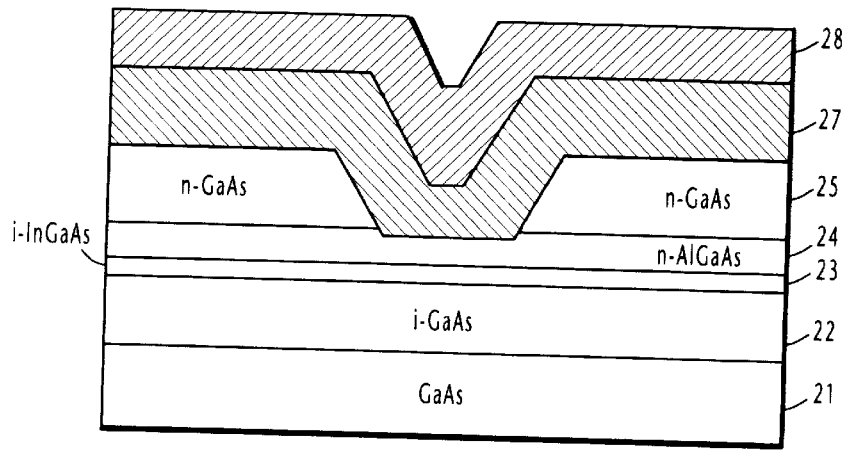
Figure 2D:
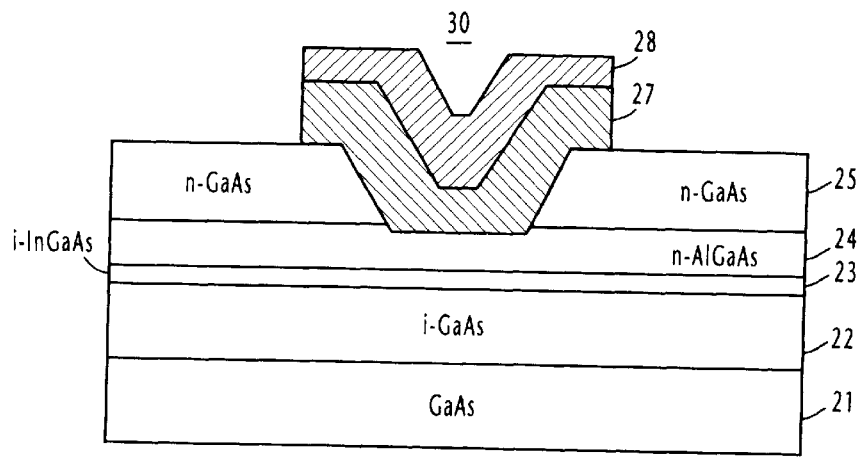

In FIG. 2B, the portion of the n-GaAs layer 25 which is exposed to the outside through the hole 26A and the underlying portion of the lower layer 24 are subject to a mixed solution of sulphuric acid and hydrogen peroxide. The wet-etching process of this mixed solutions is isotropic to GaAs and has no etching capability to the photoresist 26. Therefore, the hole 26A maintains its original dimensions, while the exposed portion of the n-GaAs layer 25 and the underlying portion of the lower n-AlGaAs layer 24 are isotropically wet-etched. As a result, there is formed a recess 25A having an undercut profile, where its sidewalls taper in a direction away from the photoresist 26 at an angle approximately 54° to the horizontal, following a direction parallel to crystal planes (111). This isotropic etching continues until the horizontal dimensions at the bottom of recess 25A equal the horizontal dimensions (i.e., 0.1 $\mu$m) of hole 26A. Although the volume of recess 25A increases as the etching process continues after its bottom dimensions are equal to the horizontal dimensions of the hole 26A, the bottom dimensions are maintained constant, thus giving an allowance to the stop timing of the etching process. The gate (channel) length of the device can therefore be precisely determined, In FIG. 2C, the photoresist 26 is removed and tungsten silicide (Wsi) is sputtered on the surface of the device to form a conductive layer 27 to establish a Schottky barrier contact with the underlying material. On the layer 26 is sputtered a laminated conductive layer 28 of TiN, Pt and Au. The upper conductive layer 28 is then etched through a photoresist, not shown, by using the ion-milling method and the lower conductive layer 27 is dry-etched by a mixture of $SF_6$ and $CF_4$ gases to produce a gate electrode 30, as shown in FIG. 2D.

Figure 2E:
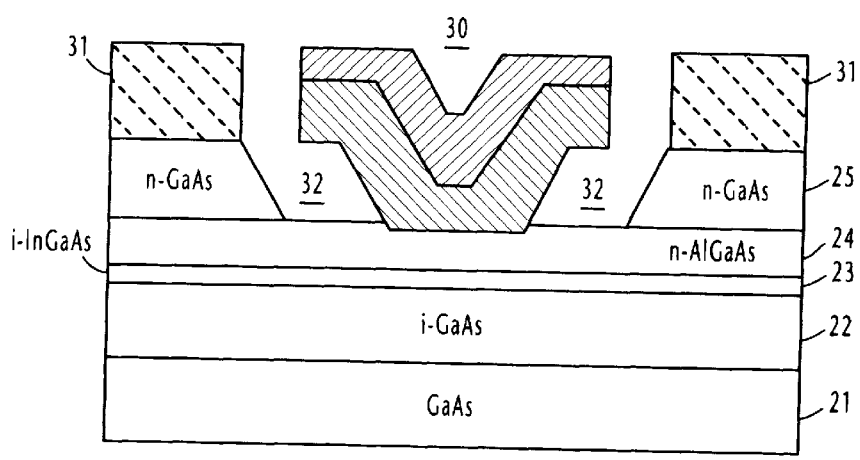
Figure 2F:
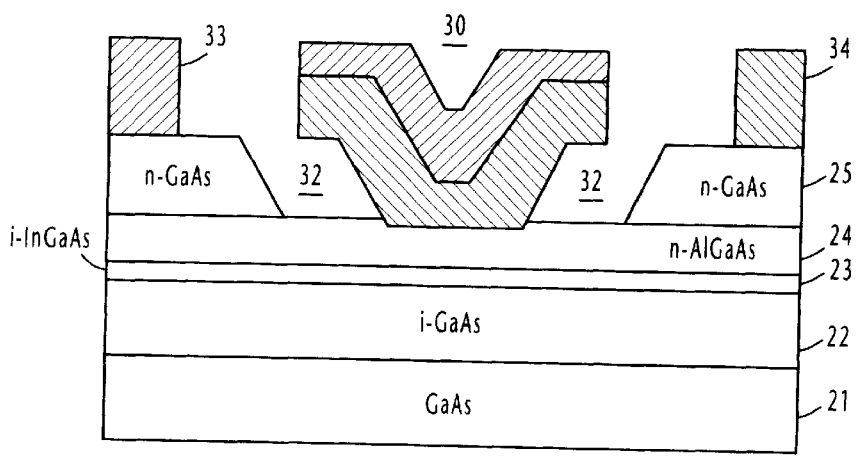

In FIG. 2E, a photoresist 31 is formed on the n-GaAs layer 25 and then the n-GaAs layer 25 is selectively and isotropically wet-etched through the photoresist 31 to create a recess 32 around the gate electrode 30. Photoresist 31 is then removed and ohmic metal is sputtered on selected areas of the device to create a source electrode 33 and a drain electrode 34 as illustrated in FIG. 2F.

It is seen that the recess 25A can be completely filled with gate metal and assure that no void can occur in the gate metal. A gate electrode of desired structural integrity can be obtained.

In the first embodiment, the etching agent is one that acts nonselectively on the layers 25 and 24. Therefore, these layers could be formed of a single layer of n-GaAs.

Figure 3A:
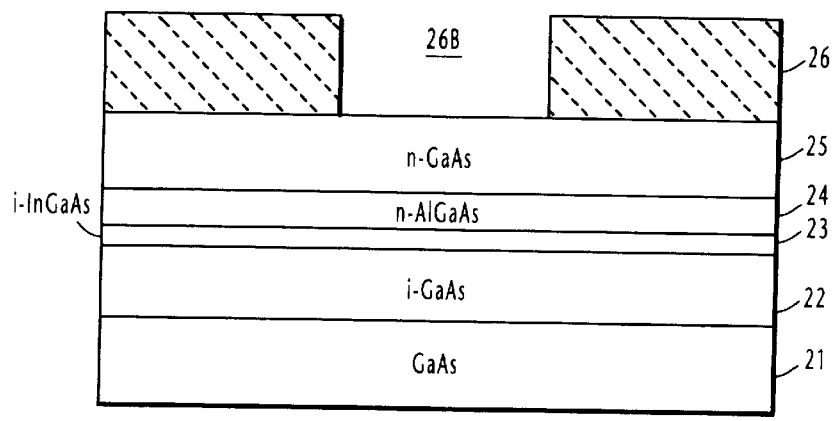
FIGS. 3A to 3F are cross-sectional views illustrating steps of fabricating a field-effect transistor of a recessed gate structure according to a second embodiment of the present invention.

A second embodiment of this invention is shown in FIGS. 3A to 3F. FIG. 3A shows that the starting structure of the second embodiment is the same as that shown in FIG. 2A, except that the photoresist layer 26 has a hole 26B which is dimensioned by taking account of an etching agent that acts selectively on the layers 25 and 24.

Figure 3B:
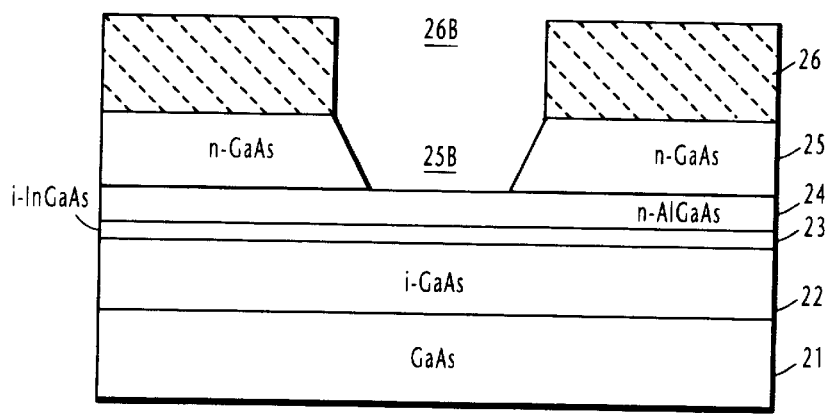

In the second embodiment, the etching solution is a mixture of citric acid with a concentration of 50 weight percent and hydrogen peroxide with a concentration of 30 weight percent, the mixture ratio in volume of citric acid to hydrogen peroxide being preferably 3 to 1. The mixed solution, which is preferably maintained at a temperature of 5 to 8° C., has no etching characteristic to the photoresist 26 but exhibits anisotropic etching characteristic to the n-GaAs layer 25. However, it has no etching capability to the underlying n-AlGaAs layer 24. The n-GaAs layer 25 is thus anisotropically wet-etched in a direction perpendicular to crystal plane (100). The mixed etching solution has a low etch rate on crystal plane (111)B. As a result, this crystal plane is exposed, forming a recess 25B whose sidewalls downwardly taper at approximately 54° to the horizontal, as illustrated in FIG. 3B.

Since the mixed solution has no etching capability on the n-AlGaAs layer 24, the etching process is continued until this layer reveals its upper surface. Thus, the dimensions at the bottom of recess 25B are determined by the dimensions of the hole 26B and the thickness of n-GaAs layer 25. Thus, the gate length of the device can be precisely controlled.

Figure 3C:
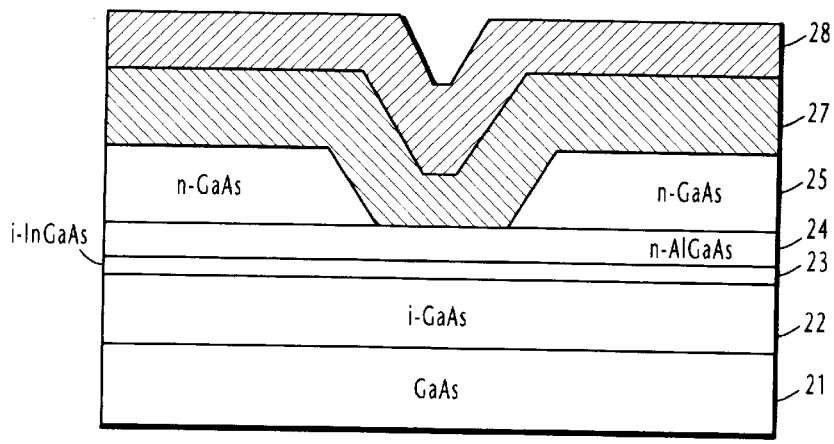
Figure 3D:
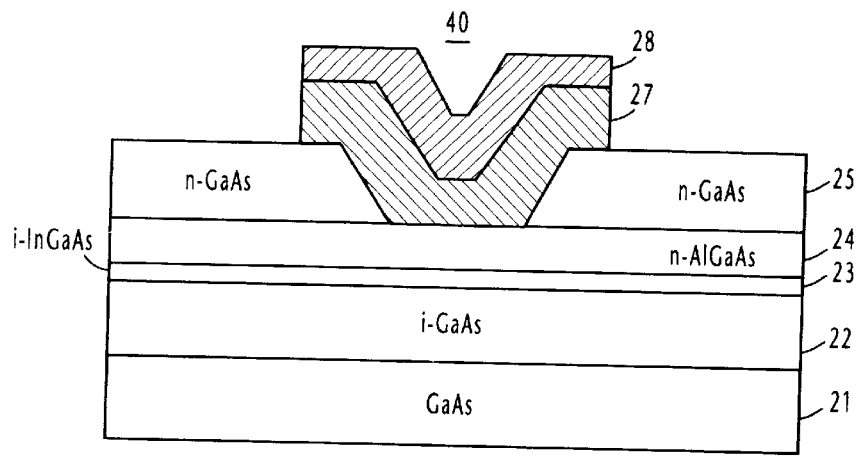

In FIG. 3C, the photoresist 26 is removed and a tungsten silicide layer 27 and a TiN—Pt—Au layer 28 are successively formed. These conductive layers etched in the same manner as that described previously to produce a gate electrode 40, as shown in FIG. 3D.

Figure 3E:
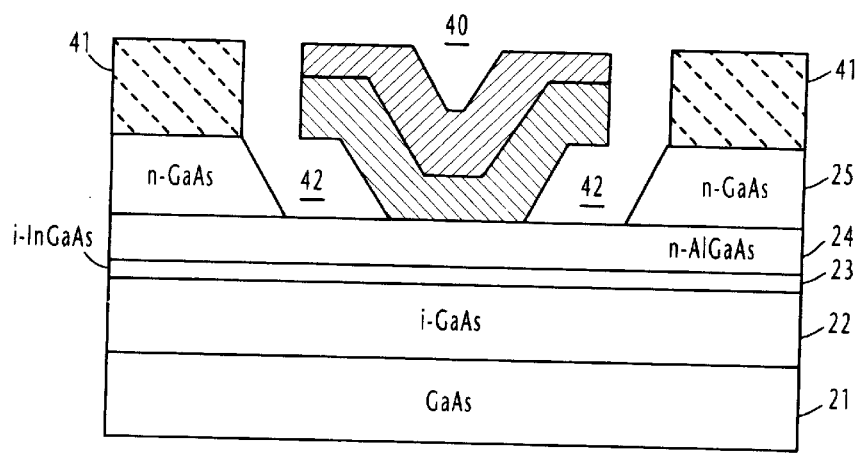
Figure 3F:
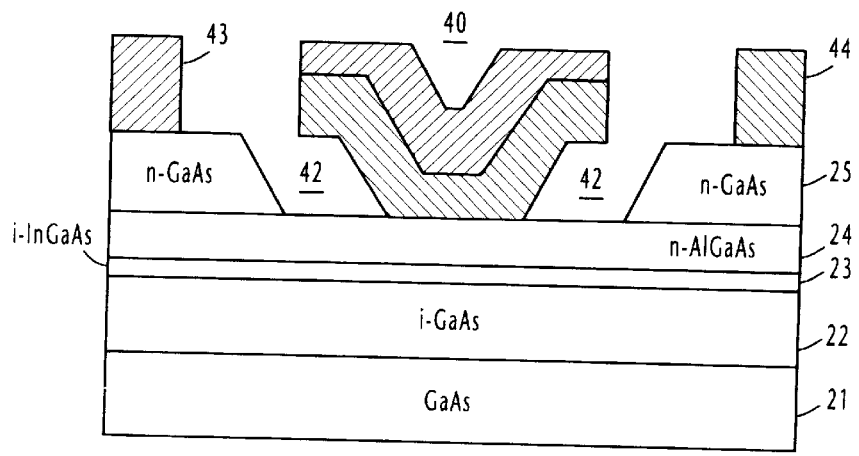

In FIG. 3E, a photoresist 41 is formed on the n-GaAs layer 25 and then the n-GaAs layer 25 is selectively and isotropically wet-etched through the photoresist 41. A recess 42 is created around the gate electrode 40. Photoresist 41 is then removed and ohmic metal is sputtered on selected areas of the device to create a source electrode 43 and a drain electrode 44 as illustrated in FIG. 3F.

Because of the high selectivity of the mixed solution of citric acid and hydrogen peroxide to the GaAs layer 25 with respect to the underlying AlGaAs layer 24, the threshold voltage ($V_{th}$) of the recessed-gate field-effect transistor can be precisely controlled.

What is claimed is:

1. A method of fabricating a field-effect transistor comprising the steps of:

a) forming a masking layer having an opening therein on laminated compound semiconductor layers, a portion of said laminated layers being crystallographically oriented in a direction toward said opening;

b) removing said portion of said laminated layers using an etching solution acting through said opening and creating a gate-forming recess having sidewalls tapering in a direction away from the masking layer;

c) filling said gate-forming recess with gate metal and forming a gate electrode so that the gate electrode is tapered equally to said sidewalls; and d) forming a recess around said gate electrode. by removing another portion of said laminated layers.

2. The method of claim 1, wherein said laminated compound semiconductor layers comprise at least one layer of GaAs, and wherein said etching solution comprises a mixture of sulphuric acid and hydrogen peroxide.

3. The method of claim 2, wherein said GaAs layer has a crystallographic orientation (100) and said sidewalls of the gate-forming recess have crystallographic orientation (111).

4. The method of claim 3, wherein step (b) is continued until the gate-forming recess has a bottom whose horizontal dimensions are equal to horizontal dimensions of said opening.

5. The method of claim 2, wherein said etching solution has the ability to act on said portion without side-etching said opening.

6. The method of claim 5, wherein said etching solution has the ability to isotropically act on said portion.

7. The method of claim 1, wherein said laminated compound semiconductor layers comprise an upper layer of GaAs formed on a lower layer of AlGaAs, and wherein said etching solution comprises a mixture of citric acid and hydrogen peroxide.

8. The method of claim 7, wherein said GaAs layer has a crystallographic orientation (100) and said sidewalls of the gate-forming recess have crystallographic orientation (111) B.

9. The method of claim 8, wherein step (b) is continued until a portion of the AlGaAs layer is revealed.

10. The method of claim 7, wherein said etching solution has the ability to act on said portion without side-etching said opening.

11. The method of claim 10, wherein said etching solution has the ability to anisotropically act on said portion and high selectivety to act on said upper layer.

12. A method of fabricating a field-effect transistor as claimed in claim 1, wherein etching solution has an etching characteristic to said portion and no etching characteristic to said masking layer.

13. A method of fabricating a field-effect transistor as claimed in claim 1, wherein said gate-forming recess has an undercut profile below said masking layer.

* * * * *